(12) United States Patent
Crocker

(10) Patent No.: US 7,947,892 B2
(45) Date of Patent: May 24, 2011

(54) VOLUME CONTROL DEVICE

(76) Inventor: James Roy Crocker, Oakland, CA (US)

( * ) Notice: Subject to any disclaimer, the term of this patent is extended or adjusted under 35 U.S.C. 154(b) by 134 days.

(21) Appl. No.: 12/435,929

(22) Filed: May 5, 2009

(65) Prior Publication Data

US 2010/0282046 A1    Nov. 11, 2010

(51) Int. Cl.
*G10H 1/46* (2006.01)
(52) U.S. Cl. ........................................................ 84/633
(58) Field of Classification Search .................. 84/633, 84/711, 723
See application file for complete search history.

(56) References Cited

U.S. PATENT DOCUMENTS

| | | | | |
|---|---|---|---|---|
| 2,699,085 A | * | 1/1955 | Zuck | 84/686 |
| 3,045,522 A | * | 7/1962 | Markowitz et al. | 84/711 |
| 3,686,508 A | * | 8/1972 | Arave | 307/139 |
| 7,582,825 B2 | * | 9/2009 | Chien et al. | 84/724 |
| 7,741,556 B2 | * | 6/2010 | Demsey et al. | 84/743 |
| 2005/0252363 A1 | * | 11/2005 | Rockett | 84/723 |

* cited by examiner

*Primary Examiner* — Jianchun Qin
(74) *Attorney, Agent, or Firm* — John Nielsen; Randick O'Dea & Tooliatos, LLP

(57) ABSTRACT

The volume control device temporarily alters the loudness of an electric musical instrument by allowing all (or part) of the audio signal to leak through a photosensitive resistor to ground. A light source is positioned so as to affect the value of the photosensitive resistor. The user indirectly controls the audio level by manipulating the light source in various ways: a control switch turns the light on and off; a selector switch determines whether the light source is normally off and turned on by the control switch, or vice versa; the brightness of the light source is adjusted by a variable resistor; and the time taken for the light to reach maximum brightness is controlled by an RC circuit. The device is removable and compatible with any electric instrument.

15 Claims, 12 Drawing Sheets

The effect of a toggle switch, killswitch, or interrupter of the prior art

The effect of the invention set to mode one.

The effect of the invention set to mode two.

The effect of the invention with the volume set to a non-zero value.

The effect of the invention with the attack time set to a non-zero value.

The effect of the invention set to mode two and with attack time set to a non-zero value.

to amplifier, effects etc

VOLUME CONTROL DEVICE

A. FIELD OF THE INVENTION

The invention broadly relates to a volume control device for use with electrical instruments, such as an electric guitar.

B. OBJECTS

The invention provides the user the ability to affect the sound of an electric instrument by manipulating its volume. This invention allows the user to create a variety of audio effects, including tremolo, rhythmic pulsation, stuttering, and volume swells. The volume shift is to (or from) a level established by the user, and occurs while the switch is activated. The invention can either raise the volume (from the predetermined volume to the original volume), or lower it (from the original volume to the predetermined volume). The time taken to transition from one volume level to the other can also be specified by the user. The invention should work with any standard electric instrument and can be moved easily from one instrument to another. No alteration to the instrument is required. There is minimal change to the audio signal beyond the desired volume change.

C. BRIEF SUMMARY OF THE INVENTION

The invention includes an electric circuit which sends a portion of an audio signal to ground, thus lowering the amount of signal sent further down the audio chain. The circuitry is secured inside a housing, with user-adjustable controls accessible from the outside. The device is connected between an instrument and amplifier by (though not restricted to) standard instrument ¼" jack sockets and cords. The device is held to the instrument by the pressure of the instrument's output socket or other means such as clamps, Velcro etc. Typically, the user makes a sound on their instrument, then taps a control switch with their hand while the sound sustains. The output volume drops with each tap and the user can create rhythmic patterns, tremolo effects, etc. Alternatively, the user can set the device so the audio output is zero until the switch is tapped. In this case, the instrument is played but not heard until the switch is pressed and the user can initiate sounds using the switch. Further, the affected output can be set to a non-zero value, producing more subtle tremolo effects. The time over which the volume changes can also be altered, fading in the sound at different rates.

Alternative embodiments include: making the device into a floor standing pedal and operated by foot; putting the control switch in a break-out box so the user can position it more conveniently; and using switches with different types of actuator, which gives the user a choice of the feel and action of the control switch. Also, removing some of the functionality could reduce manufacturing costs.

D. BACKGROUND

Effects similar to some of those achieved by the invention can be produced on an electric guitar with multiple pick-ups (transducers which convert string vibrations to electric current). Each pick-up has a volume control. A selector switch determines which pick-up is connected to the output. If two pick-ups are set to different volumes, a tremolo effect can be achieved by sustaining a note or chord on the guitar and rapidly toggling the selector switch. Typically, one of the volumes is set to zero so the sound cuts in and out completely, resulting in a stuttering effect. The tremolo can be at a steady rate, a more complex rhythmic pattern, or sporadic. The switch can also be used to 'turn on' single notes or chords.

Disadvantages of the toggle switch method include:
It only works on those electric guitars where the volume controls are connected between the pick-ups and the selector switch. In most guitars, the volume controls come after the selector switch.
The typical pick-up selector is difficult to manipulate quickly. Fast tremolo effects can become tiring to the user and the timing of effects can be inaccurate.
An audible 'click' or 'pop' can be introduced by the instantaneous volume change. For this reason, the toggle switch method is used almost exclusively by guitarists who use heavily distorted guitar tones. The distortion (added to the signal by an effects unit such as a guitar foot pedal or by tube saturation in an amplifier) masks any clicking sound.

In an attempt to emulate the toggle switch method, some guitarists wire a switch (commonly known as a 'kill switch') between the audio signal and the ground. Mounted on the face of the guitar, these spring-loaded switches short the signal, allowing a path for the live signal to leak to the ground. When pressed, they mute the output. When released, the spring returns the switch to the off position and the guitar signal is no longer muted.

Disadvantages of the kill switch method include:
A permanent alteration to the instrument is required.
The 'clicking' sound discussed earlier is, again, audible.
The switch contacts can arc as they are brought close together, introducing unwanted noise.
More unwanted noise can be introduced by 'contact bounce' (the springiness of the contacts cause them to bounce on and off each other several times before settling).
A positive physical movement by the user controls the silence, not the sound. This is counterintuitive and can be difficult to keep rhythmically accurate.
The switch is limited to shorting the entire signal.
A Removable Inline Signal Interrupter for Electric Guitar proposed by Dennis Armstrong, (Brick, N.J., US) (United States Patent Application 20080178727) attempts to create a kill switch without the need for modification to the instrument.

Disadvantages of Dennis Armstrong's Signal Interrupter include:
Aside from avoiding permanent alteration to the instrument, all the shortcomings of the kill switch discussed earlier are inherited.
The audio signal travels through wiring (or some other conduit) and a switch, even when the device is not in use. This degrades the audio quality.
Within the switch, the audio signal disconnects from one contact before it connects with the other. This is equivalent to pulling the cord in and out of the guitar and introduces unwanted 'buzz' and 'thud' noises.
The signal is never shorted. Even when the volume control is at zero, the input to the amplifier is left open. Hum or noise accumulated between the volume control and the amplifier is still audible.

The invention described herein and which is the subject of this application has numerous advantages over the existing state of the art. These advantages include the following:
It works with any standard electric instrument or electrified acoustic instrument.
The spring-operated push switch can be quickly and accurately manipulated with little effort.

All volume changes are smooth. It can even be used with an electric guitar with a clean tone and acoustic instruments without introducing undesirable 'clicks'.

No alteration to the instrument is required.

It can be easily moved from one instrument to another.

The use of an opto-electronics to isolate the audio signal from the control switch reduces potential problems arising from arcing or contact bounce.

The choice between two modes—controlling the silence and controlling the sound—offers great flexibility to the user.

The signal is shorted and thus is genuinely silent when required.

The use of an opto-electronics to isolate the audio signal from almost all mechanical and electronic components leaves the audio signal pristine. The exception is a light sensitive (photosensitive) resistor which has little or no effect on the tonal quality of the output.

E. BRIEF DESCRIPTION OF THE DRAWINGS

F. REFERENCE NUMERALS

- 20 Control circuit
- 22 Audio circuit
- 24 Opto-coupler
- 26 LED
- 28 Photosensitive resistor
- 30 Live signal
- 32 Ground
- 34 Cell
- 36 Selector switch
- 38 Control switch
- 40 NC contacts
- 42 NO contacts
- 44 Actuator
- 46 Fixed resistor
- 48 Variable resistor/Volume control
- 50 Fixed resistor
- 52 Variable resistor/Attack time control
- 54 Capacitor
- 56 Graph representing audio input -continued

- 58 Input loudness
- 60 Time
- 62 Graph showing state of actuator
- 64 Switch engaged
- 66 Switch disengaged
- 68 Graph showing audio output
- 70 Output loudness
- 72 Time
- 74 Audible 'click'
- 76 Volume level
- 78 Attack time
- 80 Housing
- 82 Male jack plug
- 84 Instrument
- 86 Instrument cord
- 88 Housing
- 90 Break-out box
- 92 Cord
- 94 Male plug
- 96 Female socket
- 98 Splitter
- 100 Male jack plug
- 102 Female jack socket
- 104 Female jack socket
- 106 Cord
- 108 Female jack socket
- 110 Foot pedal
- 112 Housing
- 114 Instrument cord
- 116 Female jack socket
- 118 Switch
- 120 Unconnected terminal
- 122 Fixed resistors

G. DETAILED DESCRIPTION OF THE INVENTION

Figure 1:
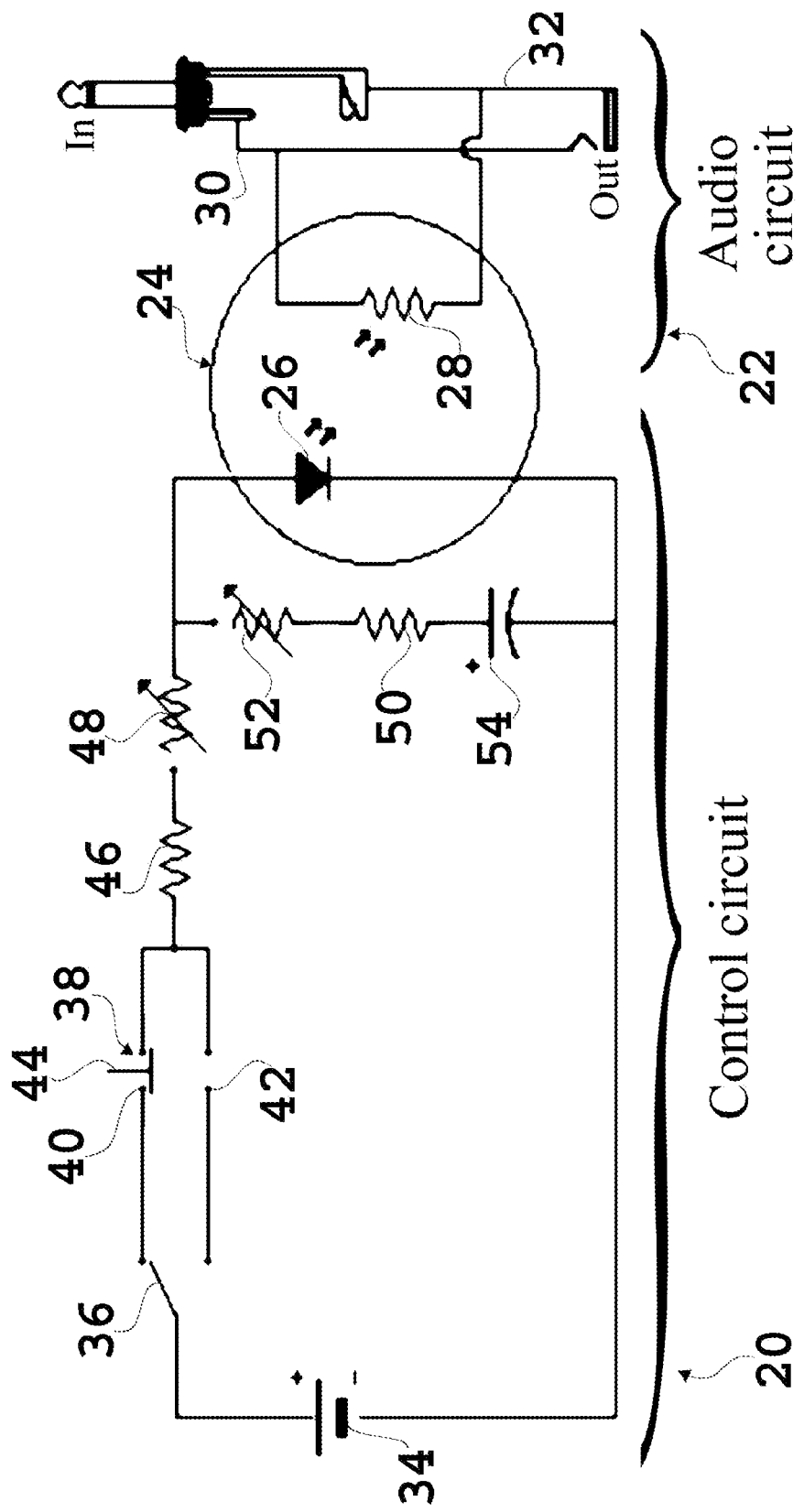
FIG. 1 is a circuit diagram showing the configuration of electrical components used to make the device.

FIG. 1 is a circuit diagram showing the arrangement of electronic components used in the volume control device. A control circuit 20 and an audio circuit 22 are joined by an opto-coupler 24. The audio circuit 22 comprises a short section of the live signal path 30 and ground path 32 which convey the audio signal from an instrument to an amplifier, recording device etc. The opto-coupler 24 internally comprises a light-emitting diode (LED) 26 and a photosensitive, or "light-dependent" resistor (LDR) 28. The LDR 28 bridges the live signal 30 and the ground 32. Preferably, a cell 34 (or battery or other power supply) is used to power the control circuit 20. It connects to a single-pole dual-throw (SPDT) selector switch 36 which, in turn, connects to a dual-pole single-throw (DPST) control switch 38. The DPST switch 38 comprises one set of normally closed (NC) contacts 40, one set of normally open (NO) contacts 42, and an actuator 44. Preferably, the switch also contains a spring which returns the actuator 44 to the disengaged position when pressure is released. One output from the selector switch 36 connects to an NC contact 40; the other connects to an NO contact 42. The two outputs from the control switch 38 join together, creating one output. A fixed resistor 46 and a variable resistor 48 connect in series with the switches 36 & 38. A second fixed resistor 50 and variable resistor 52 connect in series with a capacitor 54. These three components (50, 52 & 54) form an RC circuit which connects in parallel to the opto-coupler 24.

In darkness, the LDR 28 has a very high resistance. The audio signal is unable to pass from live 30 to ground 32 and it leaves the device unaltered. When the LED 26 lights up, the resistance of the LDR 28 falls. This allows some (or all) of the live signal 30 to leak to ground 32 and causes a drop in output volume. The brighter the LED 26 is, the lower the volume.

The user manipulates the current in the control circuit 20 to alter the brightness of the LED 26.

Figure 2A:
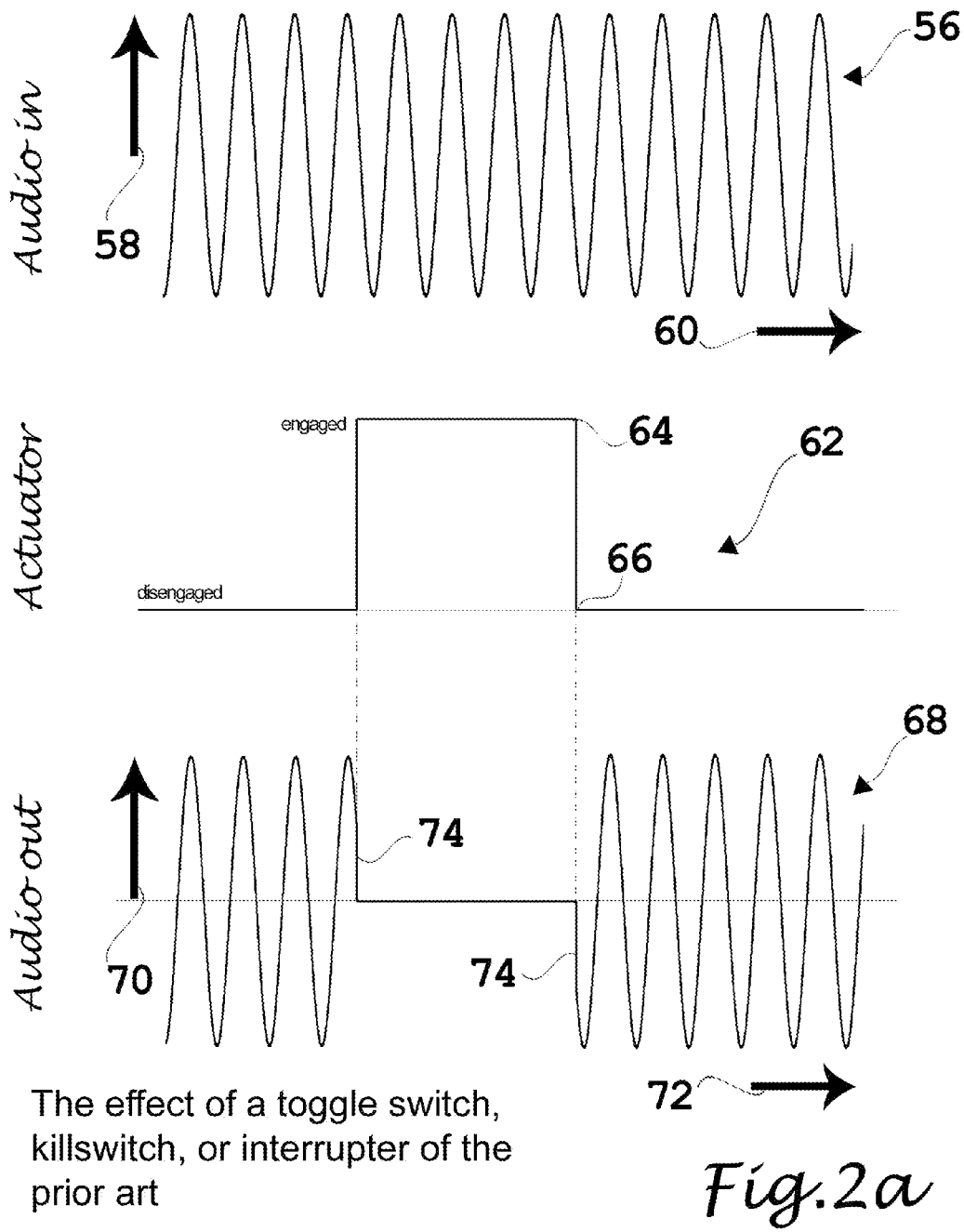
FIG. 2a illustrates the audible effect of a toggle switch, kill switch, or interrupter of the prior art.

FIGS. 2b-2f are each a series of three graphs illustrating how the audio signal is affected by the control switch 38 in different ways. FIG. 2a shows a similar series, but for a switch utilizing previously existing devices/technology (prior art) as discussed above. In each figure, the top graph shows the audio input 56 (shown as a sine wave for clarity). Displacement from zero in the y-axis represents loudness 58. The x-axis represents the flow of time 60 from left to right. The middle graph shows the state of the actuator 62. It has two possible values: engaged (when pressure is applied) 64, and disengaged (when no pressure is applied) 66. The bottom graph shows the audio output 68 from the device. Displacement from zero in the y-axis represents output loudness 70. The x-axis represents the flow of time 72 from left to right. The three graphs 56, 62, 68 are concurrent.

Figure 2B:
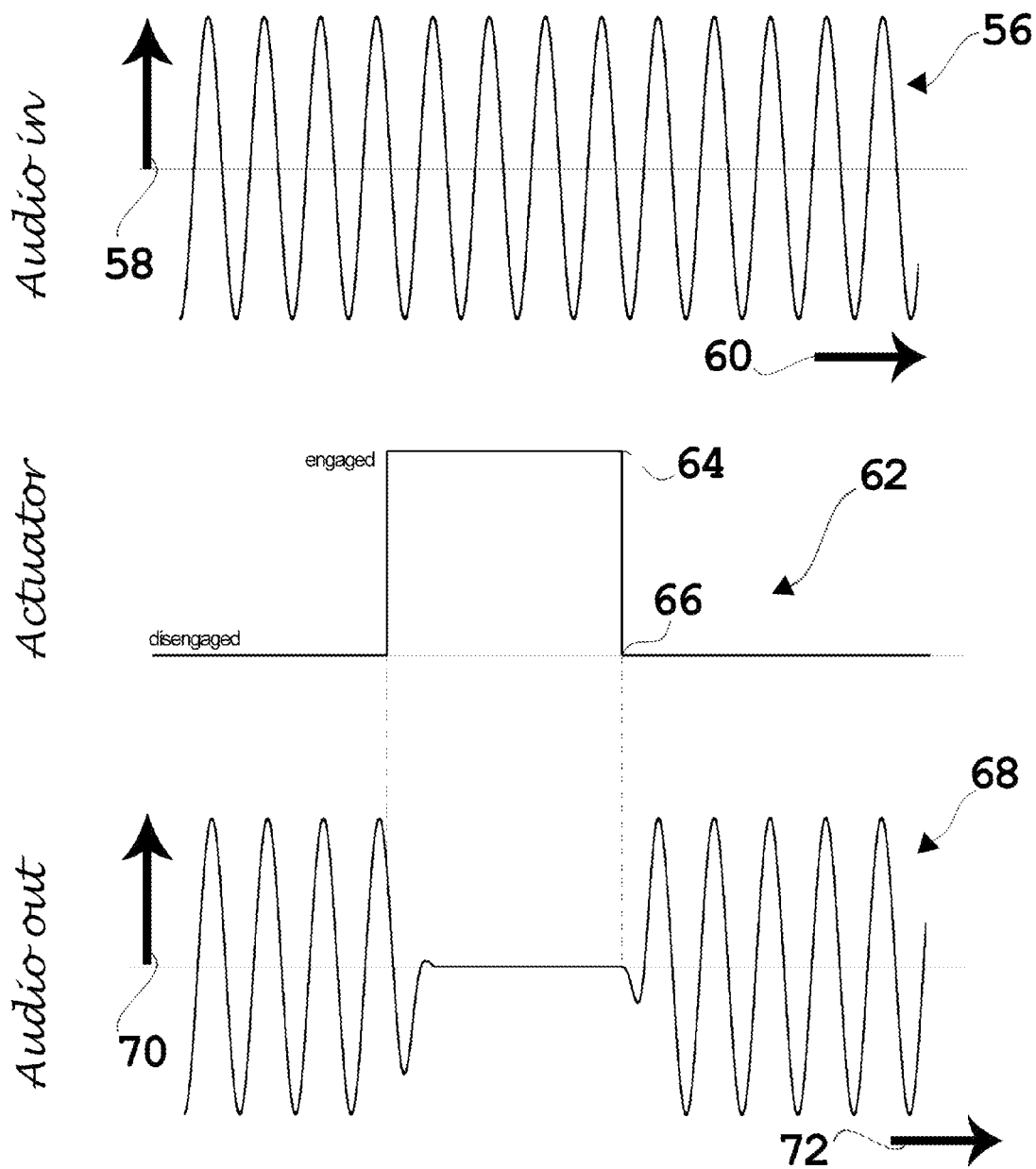
FIG. 2b illustrates the audible effect of the invention set to mode one.

FIG. 2a (prior art) shows the 'click' introduced by instantaneous switching. When the actuator 44 is engaged, the audio output immediately drops to zero. A sharp vertical line 74 indicates the actuator 44 was engaged when the audio input had a value other than zero. This line 74 models the audible clicking sound. FIG. 2b shows how this invention reacts in the same situation. Because the LED 26 lights up over a very short time period, what was an instant drop 74 is now a smooth one.

Figure 2C:
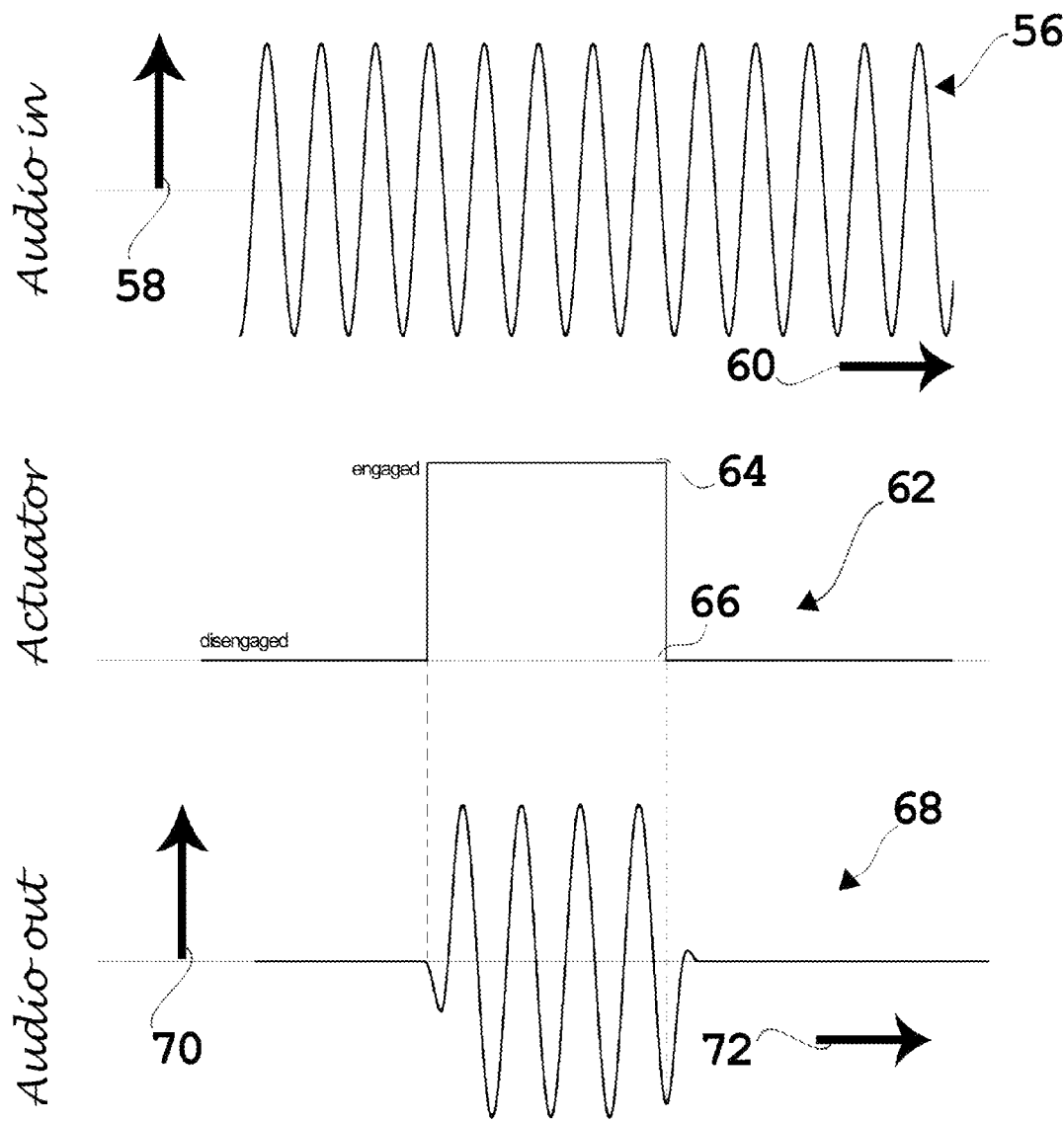
FIG. 2c illustrates the audible effect of the invention set to mode two.

The selector switch 36 determines whether the control switch 38 acts in a normally-open or normally-closed manner. Set to the former (mode one), current flows through the control circuit 20 while the actuator 44 is engaged. Engaging the actuator 44 causes the LED 26 to light up. This lowers the resistance of the LDR 28, causing a drop in output volume 68. In FIG. 2b, the device is in mode one. Set to the latter (mode two), current flows through the control circuit 20 until the actuator 44 is engaged. The output volume 68 is silent (or low) until engagement, at which point it rises to the unaltered level. FIG. 2c shows how the actuator 44 can be made to 'turn on' the sound.

Figure 2D:
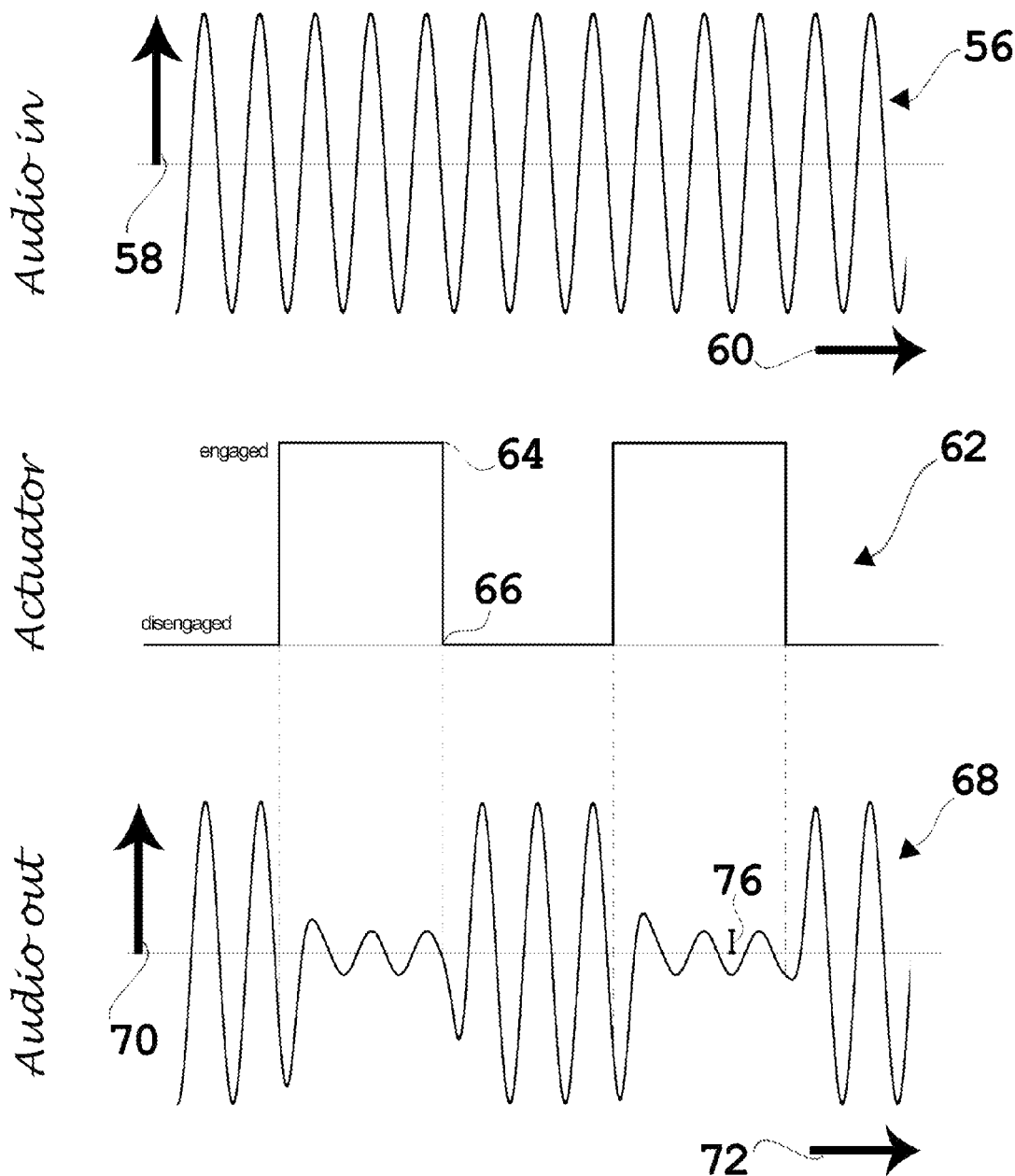
FIG. 2d illustrates the audible effect of the invention with the volume set to a non-zero value.

The fixed resistor 46 limits the current flow to a maximum, avoiding damage to the LED 26. The variable resistor 48 sets the current in the control circuit 20 to any value from zero to the maximum. In effect, the variable resistor 48 is a volume control with a range from silence to the audio input level. FIG. 2d shows the result of a non-zero setting for the volume control. In the example shown, the device is in mode one and the output falls to the lower level 76 whenever the actuator 44 is engaged. If the device were in mode two, the graph would be inverted. The audio output 68 would be at the lower level 76 until the actuator 44 was pressed, at which point it would rise to the audio input level.

Figure 2E:
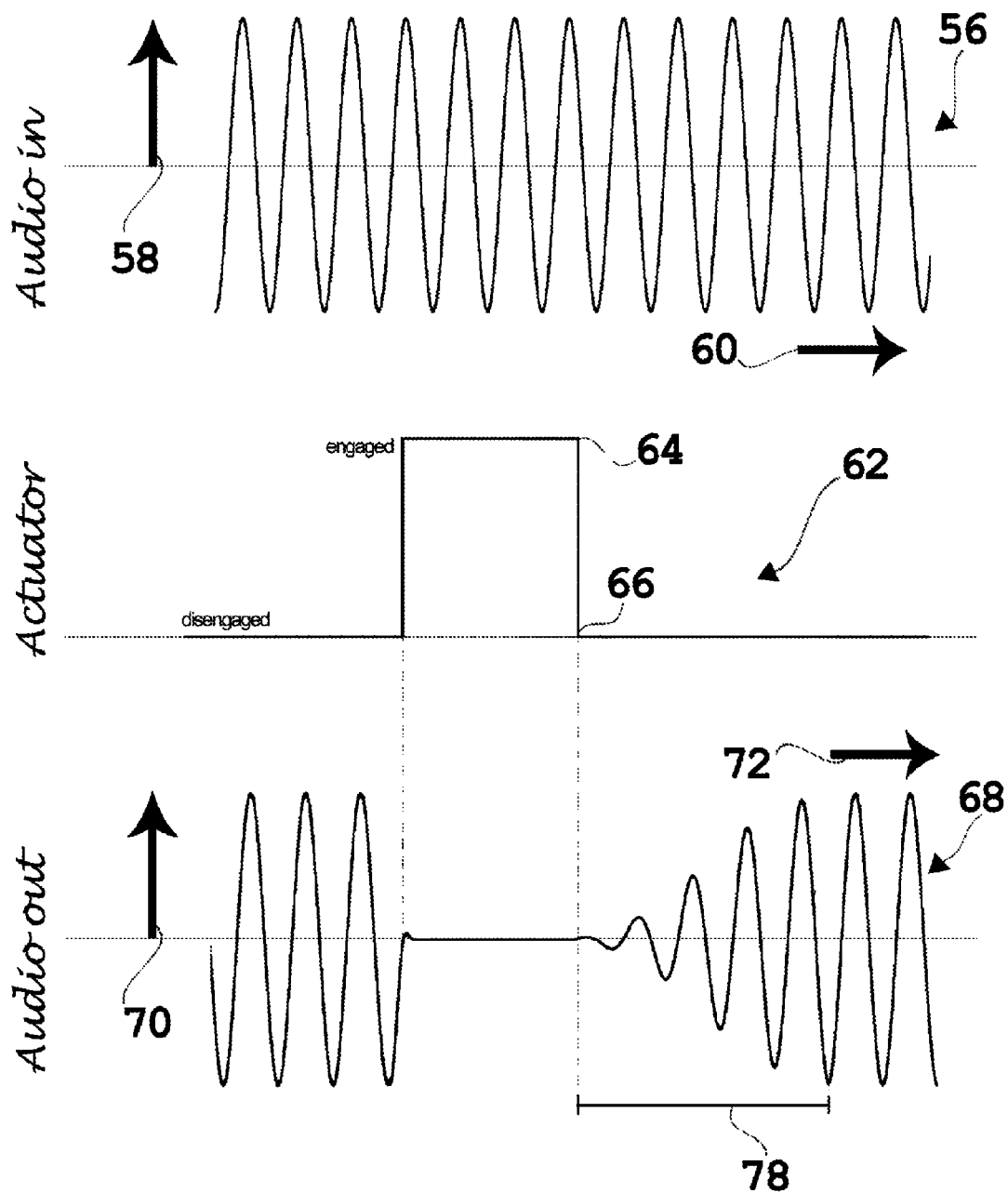
FIG. 2e illustrates the audible effect of the invention with the attack time set to a non-zero value.
Figure 2F:
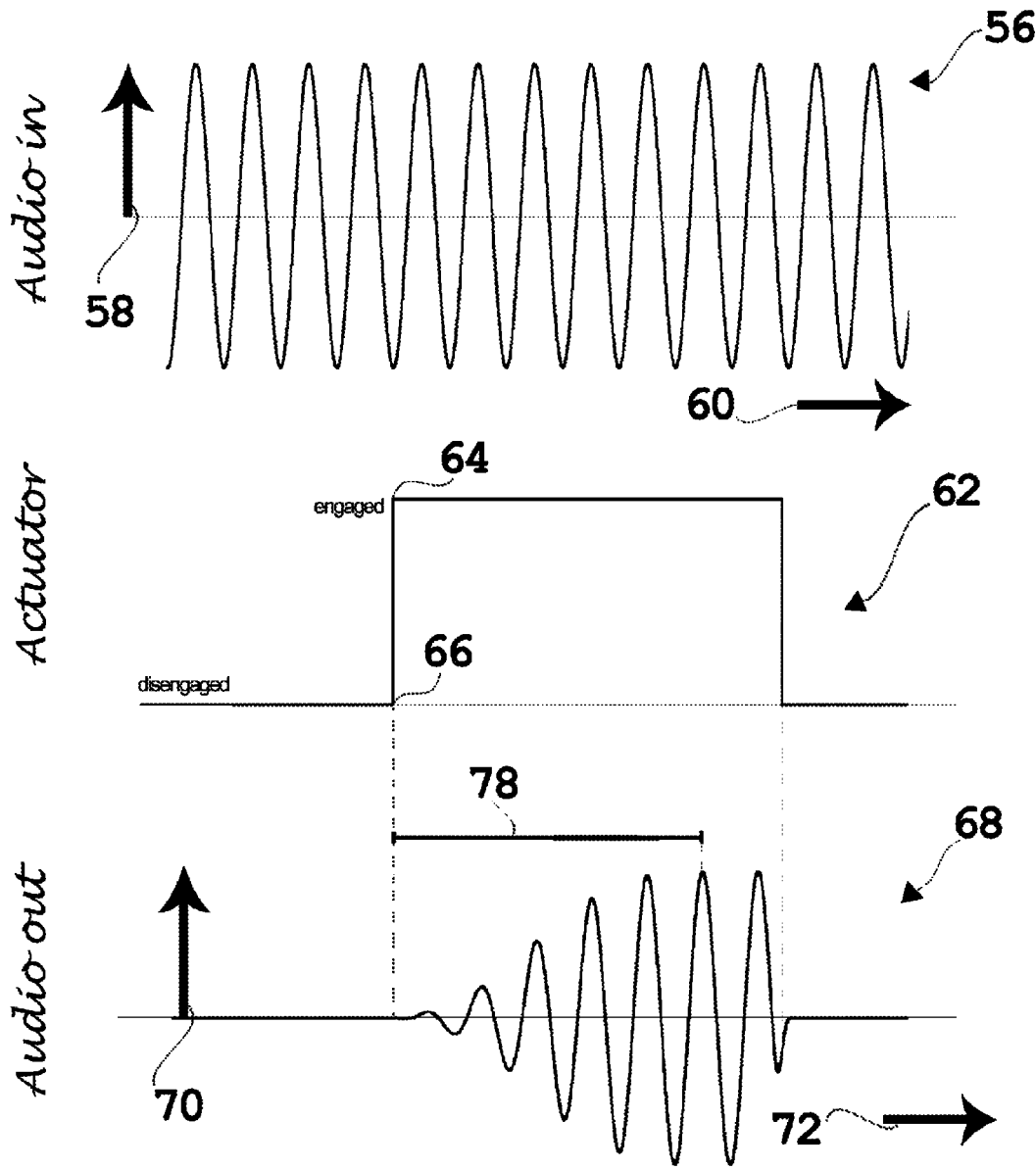
FIG. 2f illustrates the audible effect of the invention set to mode two and with the attack time set to a non-zero value.

Whenever the control switch 38 completes the control circuit 20, the capacitor 54 begins to charge. When the circuit 20 is next broken, the charge flows back, through the fixed resistor 50, variable resistor 52, and LED 26. The LED 26 dims—and consequently the audio output 68 increases—at the same rate as the capacitor 54 discharges (typically an exponential discharge). In mode one, the attack begins when the actuator 44 is released (as shown in FIG. 2e). In mode two, the attack begins when the actuator 44 is engaged (see FIG. 2f). The variable resistor 52 controls the time constant of the RC circuit. It has the effect of setting the time it takes for the audio to return to maximum or the 'attack time' 78.

Together, the selector switch 36, the volume control 48, and the attack time control 52, offer the user a wide variety of potential effects.

Figure 3:
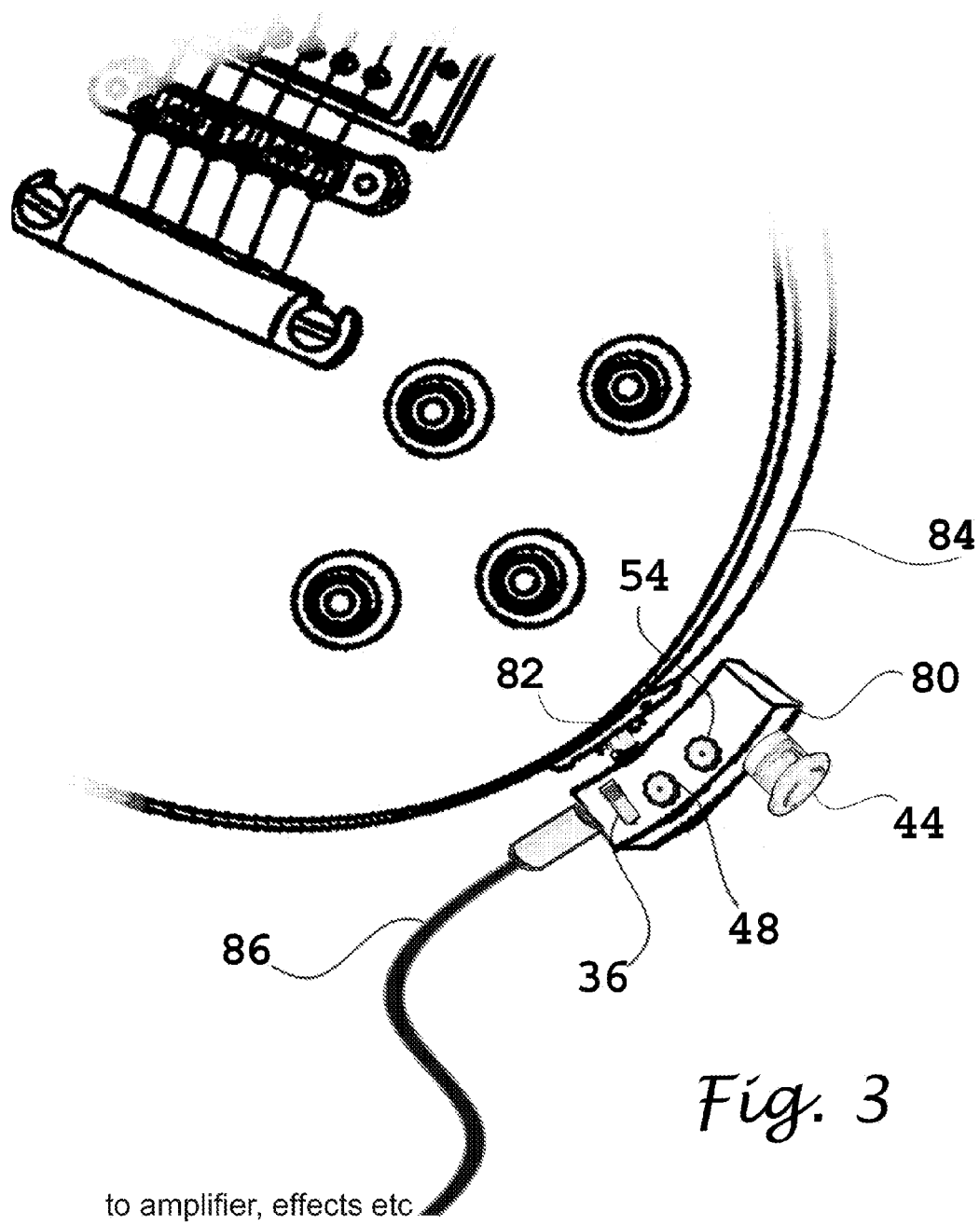
FIG. 3 is a view of the preferred embodiment of the invention.

FIG. 3 shows the preferred embodiment for the device. A housing 80 contains the electronic components. The selector switch 36, actuator 44, volume control 48 and attack time control 52 are accessible from the outside of the housing 80. A male jack socket 82 is attached to the housing 80 and connects the invention to an instrument 84 (female jack sockets are the standard on most instruments). The male jack socket 82 is attached to the housing 80 in such a way as to let it pivot, allowing it to fit both common socket types: the flat, face-mounted type shown and an angled, Fender Stratocaster type. A female jack socket (not shown) is mounted in a hole through a face of the housing 80. It can be connected to an instrument cord 86. The socket and cord 86 convey the output of the audio circuit 22 to an amplifier, recording device, effects unit, etc.

Figure 4:
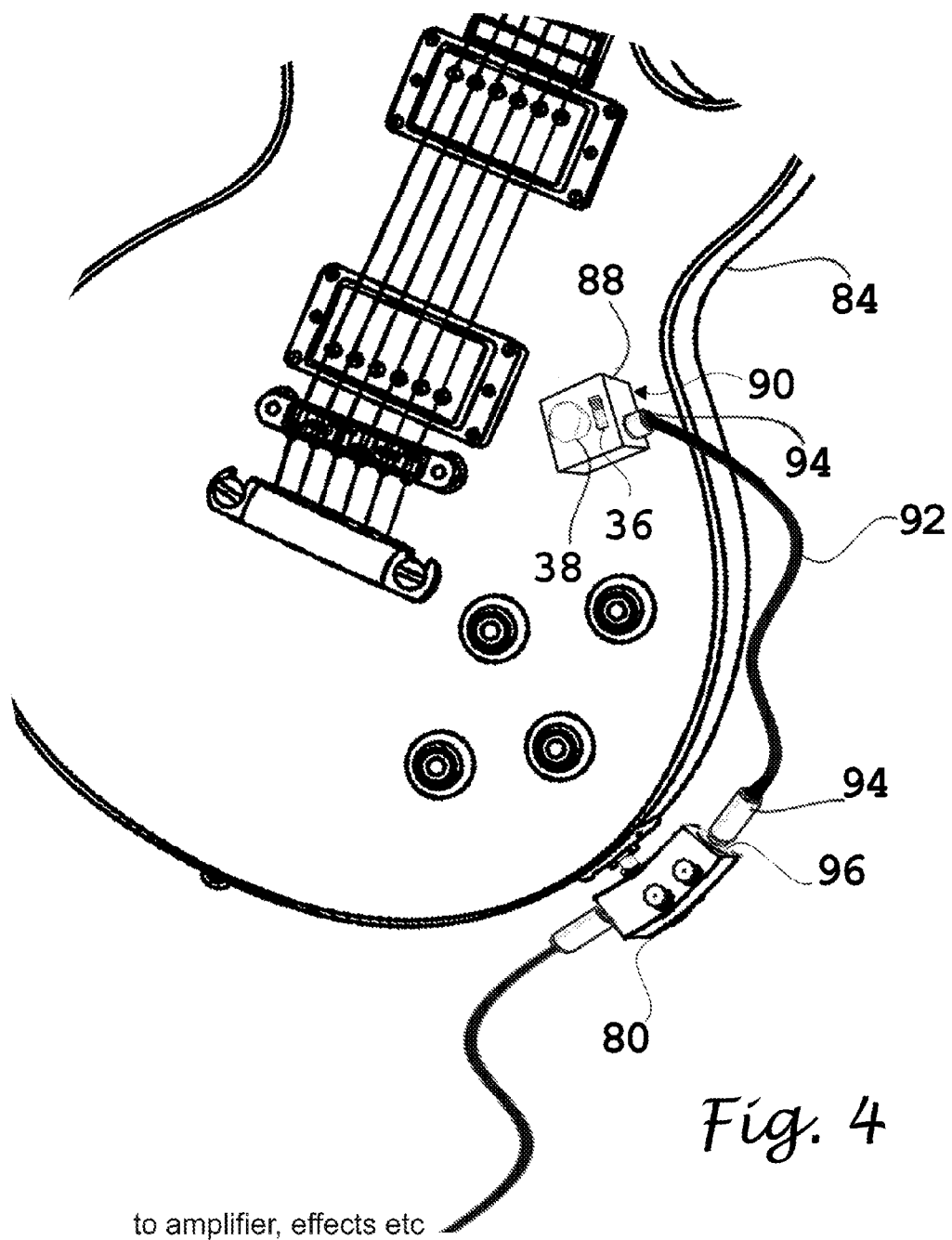
FIG. 4 is a view of an alternative embodiment of the invention.

FIG. 4 shows an alternative embodiment of the device. The selector switch 36 and control switch 38 are mounted in a second housing 88, creating a break-out box 90. The main housing 80 connects to the break-out box 90 by means of a cord 92. Within the cord 92 there are two wires or other conduits. Each connects at both ends to a terminal of a male plug 94 (for example, a mini-jack plug or an RCA plug). A corresponding female socket 96 is mounted in a hole through a face of the housings 80 and 88. The female socket 96 connects in such a way as to keep the entire circuit the same as in FIG. 1. Alternatively, either end of the cord 92 (or both) enters the housing 80 and 88 through an aperture and is hard-wired into the circuit.

The break-out box 90 can be positioned wherever most convenient to the user. It can be attached to the instrument 84 by means including Velcro, sticky tape, clamps, magnets, straps, or string. Alternatively, the break-out box 90 can be attached to the instrument strap, the user's clothing, or it can be held in the user's pocket.

Figure 5:
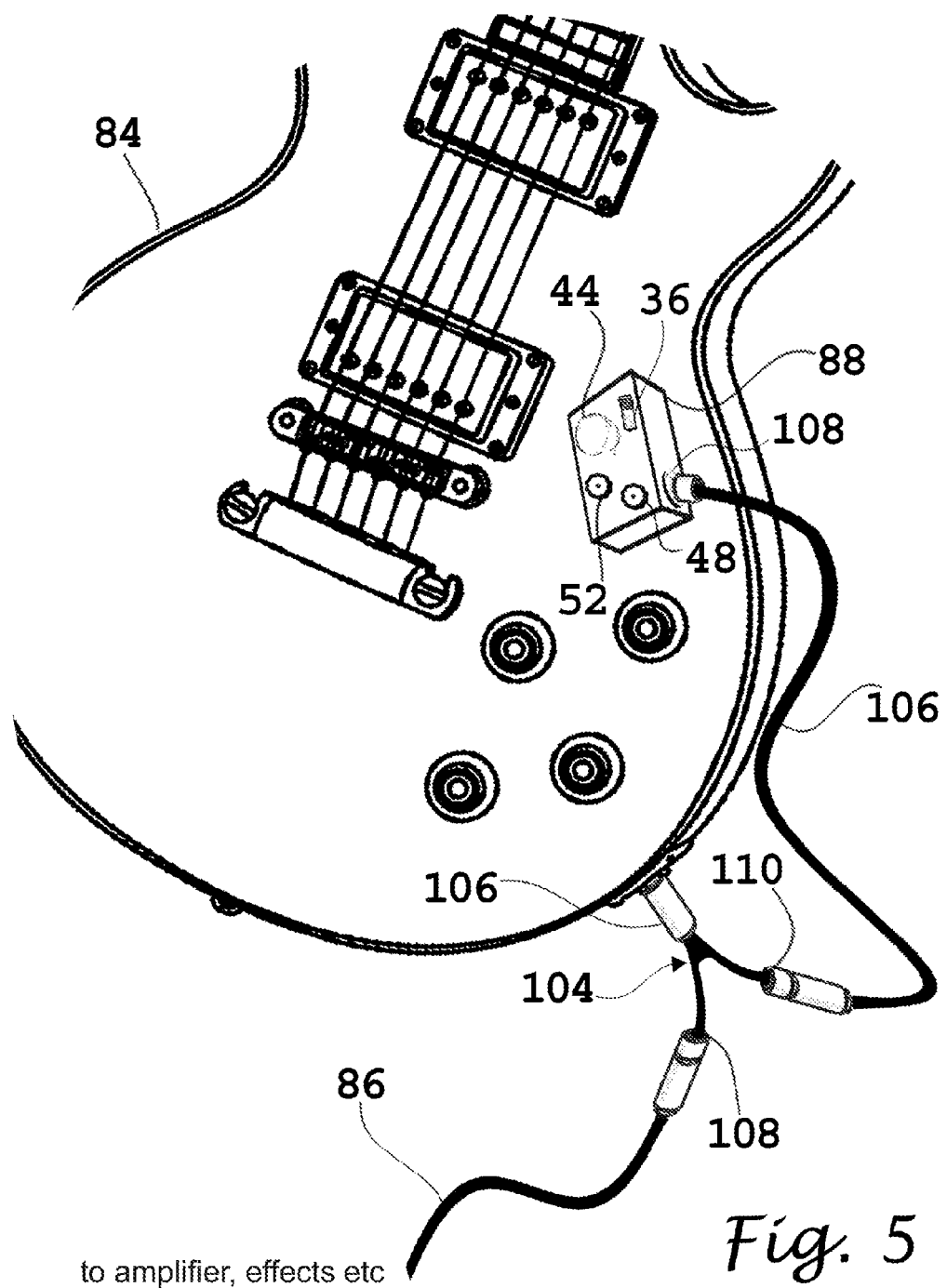
FIG. 5 is a view of a second alternative embodiment of the invention.

FIG. 5 shows a second alternative embodiment of the device. The output from the instrument 84 is divided by a splitter 98 comprising a male jack plug 100 and two female jack sockets 102 and 104. The male plug 100 connects to the output of the instrument 84. The audio signal splits and travels to both female sockets 102 & 104. One socket 102 is used to connect an instrument cord 86 conveying the output from the audio circuit 22 to an amplifier, recording device, effects unit, etc. A second cord 106 joins the second female jack socket 104 to a third female jack socket 108, mounted through a hole in a face of the housing 88. This cord 106 supplies the input to the audio circuit 22. Again, as an alternative, either end of the cord (or both) can be hard-wired in place. The housing 88 contains the electronic components. The selector switch 36, actuator 44, volume control 48, and attack time control 52 are accessible from the outside.

Figure 6:
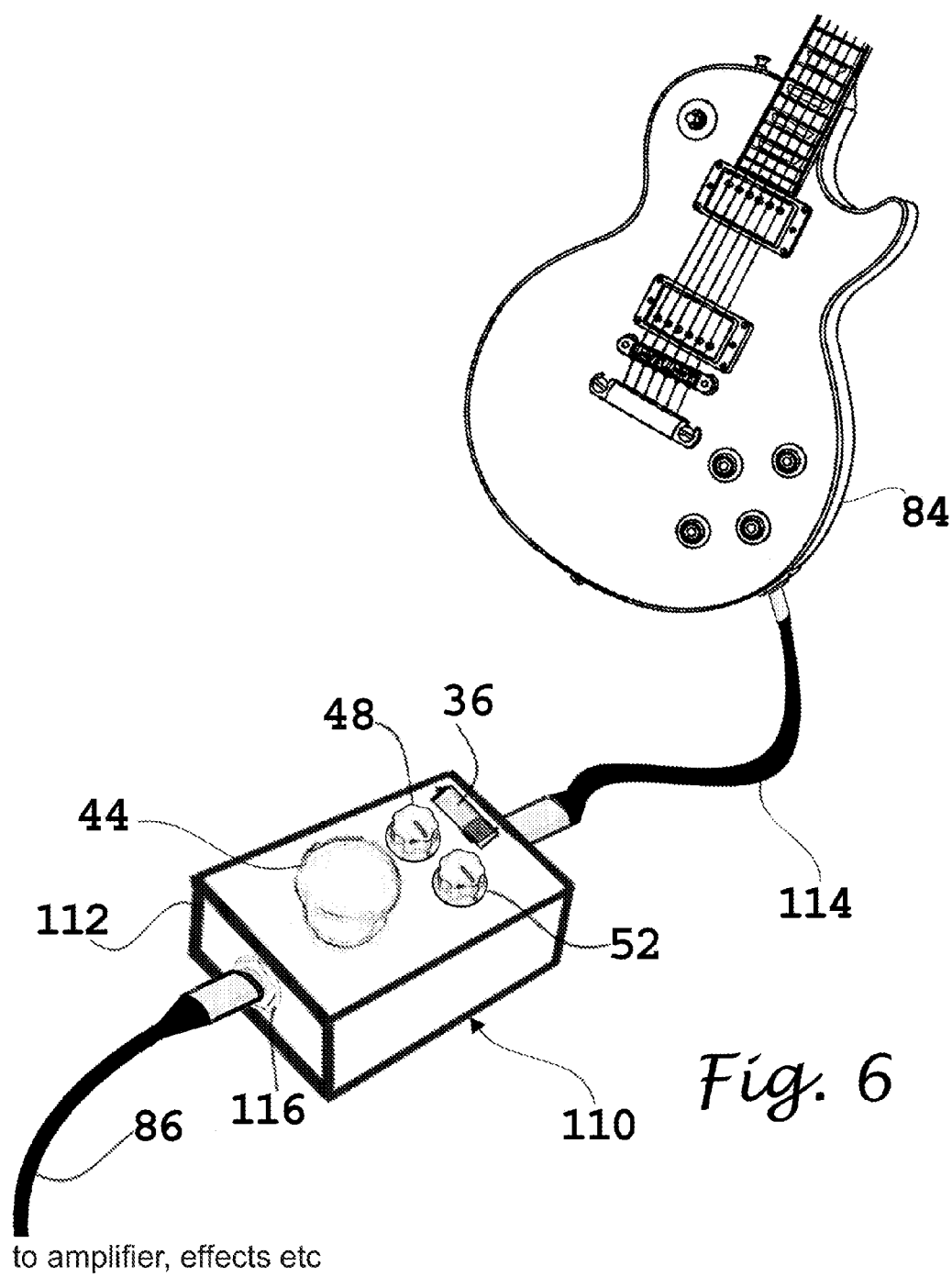
FIG. 6 is a view of a third alternative embodiment of the invention.

FIG. 6 shows a third alternative embodiment of the device. In this embodiment, the device is a foot pedal. The user can manipulate the actuator 44 with his or her foot. A floor-standing housing 112 contains the electronic components. The selector switch 36, actuator 44, volume control 48, and attack time control 52 are accessible from the outside. An instrument cord 114 connects the output of an instrument 84 to a female jack socket (not shown) mounted through a hole in a face of the housing 112. This cord 114 supplies the input to the audio circuit 22. A second female jack socket 116 is similarly mounted and can be connected to another instrument cord 86, conveying the audio output to an amplifier, recording device, effects unit, etc.

Figure 7:
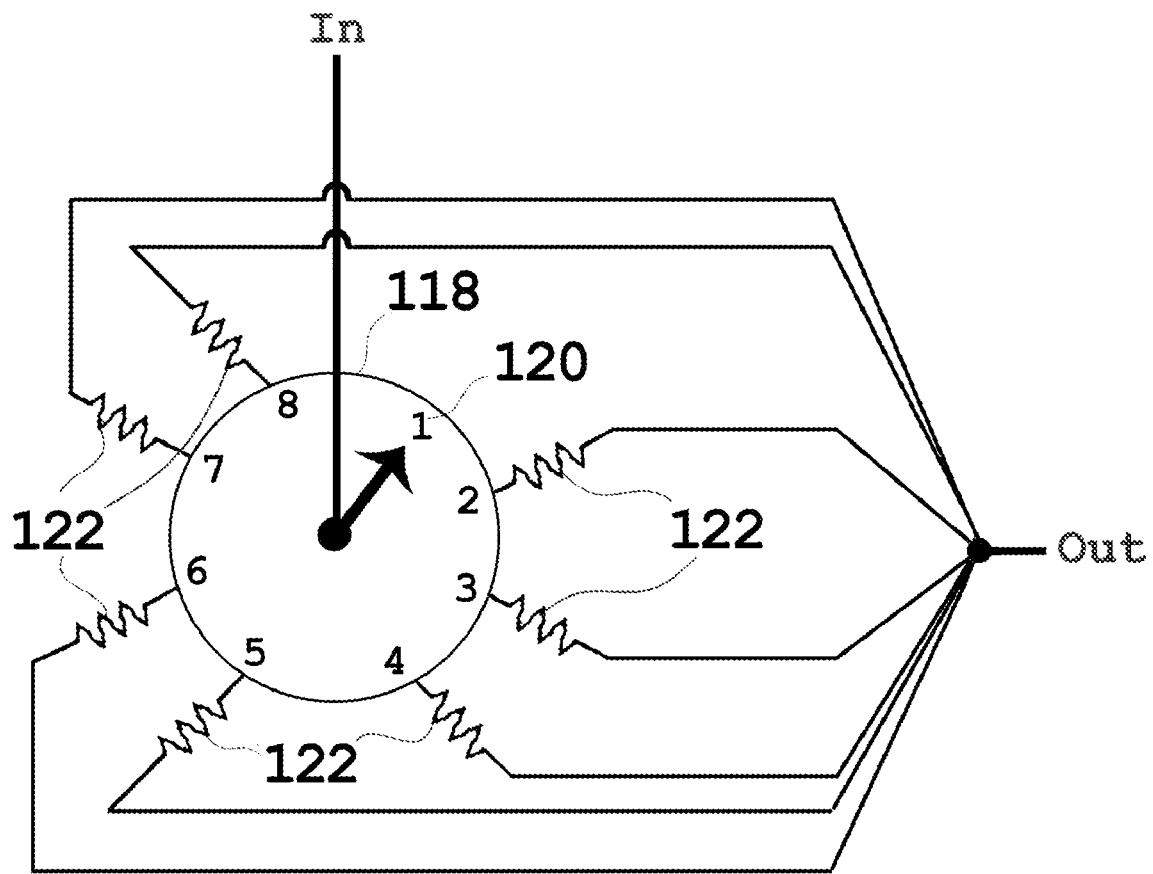
FIG. 7 is a section of a circuit diagram describing an alternative to one, or both, of the variable resistors.

An alternative to setting the volume or attack with a variable resistor is shown in FIG. 7. A single-pole, multiple-throw switch 118 has one input and several possible outputs. In FIG. 7, the switch 118 is of a rotary type and has eight terminals. One terminal is unconnected 120. Each of the others connects to a fixed resistor 122, which then all join together to form one output. The resistors 122 are of different values. When selected, the unconnected terminal 120 breaks the circuit. Selecting a different terminal allows the user to determine which resistor is in the circuit at that point. This arrangement is useful for providing consistency when setting and resetting the device at different times.

Other alternative embodiments can be created by excluding certain components. This results in less functionality, but also less manufacturing costs. For example:
- Removing the volume control sets the level 76 permanently to zero.
- Removing the capacitor 54, fixed resistor 50, and variable resistor 52 sets the attack time permanently to the length of time it takes the LED to light.
- Removing the selector switch 36 renders the device permanently in one mode (which mode depends on whether the control switch 38 is a NO or NC switch).

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Further, the purpose of the foregoing abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

I claim:

1. A manually-operated volume control for a musical instrument, said instrument having at least one output socket, said output socket comprising both live and ground pathways, said volume control comprising the following electronic components:
    a. a photosensitive resistor bridging said live and ground pathways;
    b. a light source in optical communication with the photosensitive resistor;
    c. a battery or other power source for said light source;
    d. a biased control switch for turning said light on and off, wherein said electronic components connect together to form a circuit control switch; and
    e. a selector switch capable of determining whether said control switch acts as a push-to-break or push-to-make switch.

2. The device of claim 1, further comprising a means to control the brightness of said light source.

3. The device of claim 2, wherein said brightness control is provided by a variable resistor connected in series with said switch and said light source.

4. The device of claim 2, further comprising a means to control the amount of time it takes for the light source to reach maximum brightness.

5. The device of claim 4, wherein the means to control the amount of time it takes for the light source to reach maximum brightness comprises a Resistor-Capacitor circuit (RC Circuit) connected in parallel with said light source.

6. The device of claim 5, further comprising:
    a. a housing that encloses circuitry elements;
    b. a male jack plug, accessible from the exterior of said housing, connecting into said instrument output socket and to said circuit; and
    c. a female jack socket, accessible from the exterior of said housing, connecting said circuit to an inserted instrument cable.

7. The device of claim 6, wherein said housing is stabilized via the pressure exerted by said instrument output socket.

8. The device of claim 6, further comprising:
    a. a second housing;
    b. said control switch accessible from exterior of said second housing;
    c. a cord comprising two electric pathways connecting said control switch to said circuit; and said second housing attaching to the body of the instrument or elsewhere by using one or more of the following:
        i. Velcro,
        ii. a clamp,
        iii. string, and
        iv. adhesive.

9. The device of claim 8, wherein said second housing contains one or more of said electronic components in addition to said control switch.

10. The device of claim 9, wherein said connection cord detaches at one or more ends, terminating with a plug which connects into a corresponding socket accessible from the outside of said housing or housings.

11. The device of claim 5, further comprising:
    a. a housing that encloses circuitry elements;
    b. a female jack socket, accessible from the exterior of said housing, connecting said instrument jack socket to said circuit via a patch cable; and
    c. a second female jack socket, accessible from exterior of said housing, connecting said circuit to an inserted instrument cable.

12. The device of claim 11, wherein said housing is stabilized by using one or more of the following:
    a. Velcro,
    b. a clamp,
    c. string, and
    d. adhesive.

13. The device of claim 11, wherein said housing is capable of placement on the floor or other surface, and said control switch can be operated by the user's foot.

14. The device of claim 5, further comprising:
    a. a housing that encloses circuitry element;
    b. a male jack plug for inserting into said instrument output socket;
    c. a connection cord comprising two electrical pathways for relaying said audio signal from said male plug to said circuit; and
    d. a female jack socket for relaying said audio signal from male plug to an inserted instrument cable.

15. The device of claim 14, wherein said connection cord detaches at one or more ends, terminating with a plug which connects into a corresponding socket accessible from the outside of said housing or housings.

\* \* \* \* \*